(12) United States Patent
Chang et al.

(10) Patent No.: US 10,593,674 B1
(45) Date of Patent: Mar. 17, 2020

(54) DEEP FENCE ISOLATION FOR LOGIC CELLS

(71) Applicant: GLOBALFOUNDRIES Inc., Grand Cayman (KY)

(72) Inventors: Ming-Cheng Chang, Dresden (DE); Nigel Chan, Dresden (DE); Elliot John Smith, Carpinteria, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 1 day.

(21) Appl. No.: 16/129,221

(22) Filed: Sep. 12, 2018

(51) Int. Cl.
| | |
|---|---|
| *H01L 29/78* | (2006.01) |
| *H01L 27/092* | (2006.01) |
| *H03K 19/0948* | (2006.01) |
| *H01L 21/762* | (2006.01) |
| *H01L 29/423* | (2006.01) |
| *H01L 21/8238* | (2006.01) |
| *H01L 29/06* | (2006.01) |
| *H01L 27/088* | (2006.01) |
| *H01L 27/02* | (2006.01) |

(52) U.S. Cl.
CPC ...... *H01L 27/0928* (2013.01); *H01L 21/7624* (2013.01); *H01L 21/823892* (2013.01); *H01L 27/0203* (2013.01); *H01L 27/088* (2013.01); *H01L 29/0649* (2013.01); *H01L 29/0684* (2013.01); *H01L 29/42356* (2013.01); *H01L 29/7827* (2013.01); *H01L 29/7831* (2013.01); *H03K 19/0948* (2013.01)

(58) Field of Classification Search
None
See application file for complete search history.

(56) References Cited

U.S. PATENT DOCUMENTS

| | | | |
|---|---|---|---|
| 8,293,615 B2 | 10/2012 | Cheng et al. | |
| 9,159,402 B2 | 10/2015 | Asthana et al. | |
| 9,570,465 B2 | 2/2017 | Vinet et al. | |
| 9,608,112 B2 | 3/2017 | Smith et al. | |
| 9,698,179 B2 | 7/2017 | Smith et al. | |
| 2015/0294984 A1* | 10/2015 | Cheng | H01L 27/1203 257/347 |

* cited by examiner

*Primary Examiner* — Cheung Lee
(74) *Attorney, Agent, or Firm* — Thompson Hine LLP

(57) ABSTRACT

Structures for field-effect transistors and methods for fabricating a structure for field-effect transistors. A logic cell includes first and second field-effect transistors and a well defining a back gate that is arranged beneath the first and second field-effect transistors. A dielectric layer is arranged between the well and the logic cell. A plurality of deep trench isolation regions extend through the dielectric layer and are arranged to surround the first and second field-effect transistors and the well. The back gate is shared by the first and second field-effect transistors.

20 Claims, 3 Drawing Sheets

US 10,593,674 B1

DEEP FENCE ISOLATION FOR LOGIC CELLS

BACKGROUND

The invention relates generally to semiconductor devices and integrated circuit fabrication and, in particular, to structures for field-effect transistors and methods for fabricating a structure for field-effect transistors.

Complementary-metal-oxide-semiconductor processes may be used to build a combination of p-type and n-type field-effect transistors that are used to construct, for example, logic cells. Field-effect transistors generally include a channel region, a source, a drain, and a gate electrode. When a control voltage exceeding a characteristic threshold voltage is applied to the gate electrode, carrier flow occurs in the channel region between the source and drain to produce a device output current.

Field-effect transistors fabricated using semiconductor-on-insulator technologies may exhibit certain performance improvements in comparison with comparable field-effect transistors built directly in a bulk silicon substrate. Generally, a silicon-on-insulator (SOI) wafer includes a thin device layer of semiconductor material, a substrate, and a thin buried insulator layer, such as a buried oxide layer, physically separating and electrically isolating the device layer from the substrate. Contingent on the thickness of the device layer, a field-effect transistor may operate in a fully-depleted mode (FDSOI) in which the channel region in extends fully across the device layer to the buried insulator layer when typical control voltages are applied to the gate electrode.

Despite the advantages afforded by silicon-on-insulator technologies, switching delay and standby leakage are concerns for FDSOI logic cells when the field-effect transistors are operating in a fully-depleted mode. In addition, dual-gate dynamic switching of FDSOI logic cells cannot be achieved due to an inability to share back gates between the field-effect transistors constituting a logic cell.

Improved structures for field-effect transistors and methods for fabricating a structure for field-effect transistors are needed.

SUMMARY

In an embodiment of the invention, a structure includes a logic cell with a first field-effect transistor and a second field-effect transistor, and a well defining a back gate that is arranged beneath the first field-effect transistor and the second field-effect transistor. A dielectric layer is arranged between the well and the logic cell, and a plurality of deep trench isolation regions extend through the dielectric layer. The deep trench isolation regions are arranged to surround the first field-effect transistor, the second field-effect transistor, and the well. The back gate is shared by the first field-effect transistor and the second field-effect transistor.

In an embodiment of the invention, a method includes forming a well in a substrate of a silicon-on-insulator wafer, forming a plurality of deep trench isolation regions extending through a buried insulator layer of the silicon-on-insulator wafer and arranged to surround the well, and forming a first field-effect transistor and a second field-effect transistor of a logic cell using a device layer of the silicon-on-insulator wafer. The first field-effect transistor and the second field-effect transistor are arranged over the well. The buried insulator layer of the silicon-on-insulator wafer is arranged between the well and the logic cell, and the well defines a back gate that is shared by the first field-effect transistor and the second field-effect transistor.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
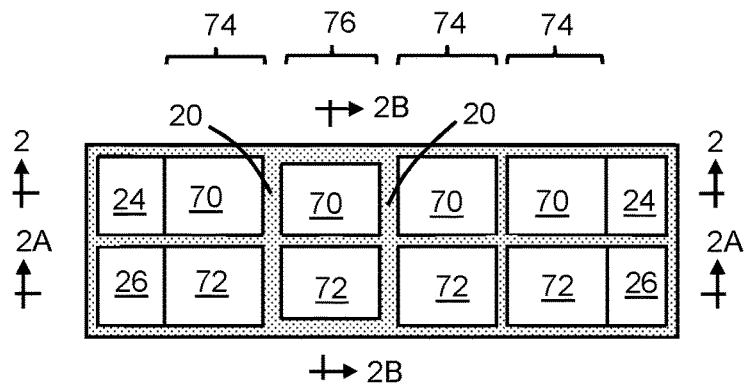
FIG. 1 is a top view of a structure at an initial fabrication stage of a processing method in accordance with an embodiment of the invention.

With reference to FIGS. 1, 2A, 2B, 2C and in accordance with an embodiment of the invention, a silicon-on-insulator (SOI) wafer 10 includes a device layer 12, a buried insulator layer 14 that may be composed of an oxide of silicon (e.g., $SiO_2$), and a substrate 16. The device layer 12 and the substrate 16 may be composed of a single-crystal semiconductor material, such as single-crystal silicon (Si). The device layer 12 is separated from the substrate 16 by the intervening buried insulator layer 14 and may be considerably thinner than the substrate 16. In an embodiment, the device layer 12 may have a thickness that ranges from about 3 nanometers (nm) to about 100 nm. In an embodiment, the device layer 12 may have a thickness in an ultra-thin regime (i.e., about 3 nm to about 10 nm) suitable to manufacture fully-depleted SOI devices (FDSOI). The buried insulator layer 14 directly contacts the substrate 16 along an interface and directly contacts the device layer 12 along another interface, and these interfaces are separated by the thickness of the buried insulator layer 14 and may terminate at the outer rim of the silicon-on-insulator wafer 10. The substrate 16 may be lightly doped to have, for example, p-type conductivity.

Shallow trench isolation regions 18 may be formed by defining shallow trenches extending through the device layer 12 to the buried insulator layer 14 with lithography and etching processes, depositing a dielectric material to fill the shallow trenches, and planarizing and/or recessing the dielectric material. The dielectric material comprising the shallow trench isolation regions 18 may be an oxide of silicon (e.g., silicon dioxide) and/or another electrical insulator deposited by chemical vapor deposition (CVD).

Deep trench isolation regions 20 may be formed by defining deep trenches extending through the device layer 12 and buried insulator layer 14 and into the substrate 16 with lithography and etching processes, depositing a dielectric material to fill the deep trenches, and planarizing and/or recessing the dielectric material. The dielectric material comprising the deep trench isolation regions 20 may be an oxide of silicon (e.g., silicon dioxide) and/or another electrical insulator deposited by chemical vapor deposition. The deep trench isolation regions 20 may be formed independent of the formation of the shallow trench isolation regions 18.

The silicon-on-insulator wafer 10 may be considered to include device areas 70 and device areas 72 that are used in the process flow to fabricate complementary field-effect transistors. The device areas 70, 72 may be grouped in logic cells 74, 76. Each of the logic cells 74, 76 may include one of the device areas 70 and one of the device areas 72. In particular, the logic cell 76 includes the device area 70 and the device area 72 that are surrounded by the deep trench isolation regions 20, which define a deep fence isolation ring.

Back-gate contact areas 24 and back-gate contact areas 26 are formed by lithography and etching processes that remove the device layer 12 and buried insulator layer 14 in respective hybrid areas at the periphery of the device areas 70, 72. To that end, an etch mask (not shown) may be formed by lithography in which a photoresist layer is applied, exposed to a pattern of radiation projected through a photomask, and developed to form openings situated at the intended locations for the back-gate contact areas 24, 26. The patterned photoresist layer is used as an etch mask for an etching process, such as a reactive-ion etching (RIE) process, that removes unmasked portions of the device layer 12 and buried insulator layer 14 to expose the substrate 16 and define the back-gate contact areas 24, 26 of the substrate 16. The etching process may be conducted in a single etching step or multiple etching steps. Sections of a semiconductor layer 28 may be formed on the substrate 16 in the back-gate contact areas 24, 26 to decrease the height difference relative to the device areas 70, 72.

The substrate 16 is provided with p-wells and n-wells in the device areas 70, 72. To that end, a well 30 is formed in the substrate 16 within the device areas 70 of logic cells 74 and the back-gate contact areas 24, a well 32 is formed in the substrate 16 within the device areas 72 of logic cells 74 and the back-gate contact areas 26, and a well 34 is formed in the substrate 16 within the device area 70 and device area 72 of logic cell 76 that is surrounded by the deep trench isolation regions 20. The wells 30, 32, 34 each extend in a vertical direction within the substrate 16 to a depth that is shallower than the depth of the tips of the deep trench isolation regions 20, and are arranged below the interface of the substrate 16 with the buried insulator layer 14. The deep trench isolation regions 20 electrically and physically isolate the well 34 from the well 30 and from the well 32.

The well 30 may be formed by introducing a dopant into the substrate 16 within the device areas 70 of logic cells 74 and the back-gate contact areas 24. In an embodiment, the well 30 may be formed by implanting ions containing the dopant under a given set of implantation conditions (e.g., ion species, dose, kinetic energy, implantation angle). In an embodiment, the well 30 may contain a concentration of a p-type dopant from Group V of the Periodic Table (e.g., boron (B) and/or indium (In)) that provides p-type electrical conductivity. The ions used to form the well 30 may be generated from a suitable source gas and implanted into the substrate 16 with the given implantation conditions using an ion implantation tool. The device areas 72, the device areas 70, 72 of logic cell 76, and the back-gate contact areas 26 may be masked by an implantation mask during the formation of the well 30. The back-gate contact areas 24 provide a back gate tap for the well 30 and may be subsequently contacted through the sections of the semiconductor layer 28 to permit back gate biasing of field-effect transistors formed using the device areas 70 of logic cells 74.

The well 32 may be formed by introducing a dopant into the substrate 16 within the device areas 72 of logic cells 74 and back-gate contact areas 26. In an embodiment, the well 32 may be formed by implanting ions containing the dopant under a given set of implantation conditions (e.g., ion species, dose, kinetic energy, implantation angle). The semiconductor material of the well 32 is doped to have an opposite conductivity type from the semiconductor material of the well 30. In an embodiment, the well 32 may contain a concentration of an n-type dopant from Group V of the Periodic Table (e.g., phosphorus (P), arsenic (As), and/or antimony (Sb)) that provides n-type conductivity. The ions used to form the well 32 may be generated from a suitable source gas and implanted into the substrate 16 with the given implantation conditions using an ion implantation tool. The device areas 70, the device areas 70, 72 of logic cell 76, and the back-gate contact areas 24 may be masked by an implantation mask during the formation of the well 32. The back-gate contact areas 26 provide a back gate tap for the well 32 and may be subsequently contacted through the sections of the semiconductor layer 28 to permit back gate biasing.

The well 34 may be formed by introducing a dopant into the substrate 16 within both of the device areas 70, 72 of logic cell 76. In an embodiment, the well 34 may be formed by implanting ions containing the dopant under a given set of implantation conditions (e.g., ion species, dose, kinetic energy, implantation angle). The ions used to form the well 34 may be generated from a suitable source gas and implanted into the substrate 16 with the given implantation conditions using an ion implantation tool. The device areas 70, 72 of the logic cells 74 and the back-gate contact areas 24, 26 may be masked by an implantation mask during the formation of the well 34. In alternative embodiments, the well 34 may be formed concurrently with either well 30 or well 32 and with an associated modification to the masking scheme. The interface between the deep trench isolation regions 20 and the well 34 defines an outer boundary of the well 34.

In an embodiment, the semiconductor material of the well 34 may be doped to have the same conductivity type as the semiconductor material of the well 30 and an opposite conductivity type from the well 32. In an embodiment, the well 34 may contain a concentration of a p-type dopant from Group V of the Periodic Table (e.g., boron (B) and/or indium (In)) that provides p-type electrical conductivity. In an embodiment, the well 34 may be concurrently formed (for example, co-implanted) with the well 30 by changing the masking when well 30 is formed.

In an embodiment, the semiconductor material of the well 34 may be doped to have the same conductivity type as the semiconductor material of the well 32 and an opposite conductivity type from the well 30. In an embodiment, the well 34 may contain a concentration of an n-type dopant from Group V of the Periodic Table (e.g., phosphorus (P), arsenic (As), and/or antimony (Sb)) that provides n-type conductivity. In an embodiment, the well 34 may be concurrently formed (for example, co-implanted) with the well 32 by changing the masking when well 32 is formed.

Figure 2:
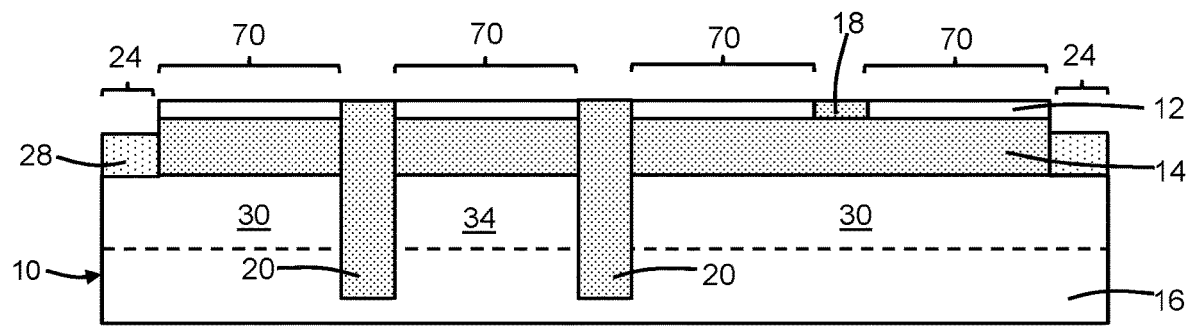
FIG. 2 is a cross-sectional view taken generally along line 2-2 in FIG. 1.
Figure 2A:
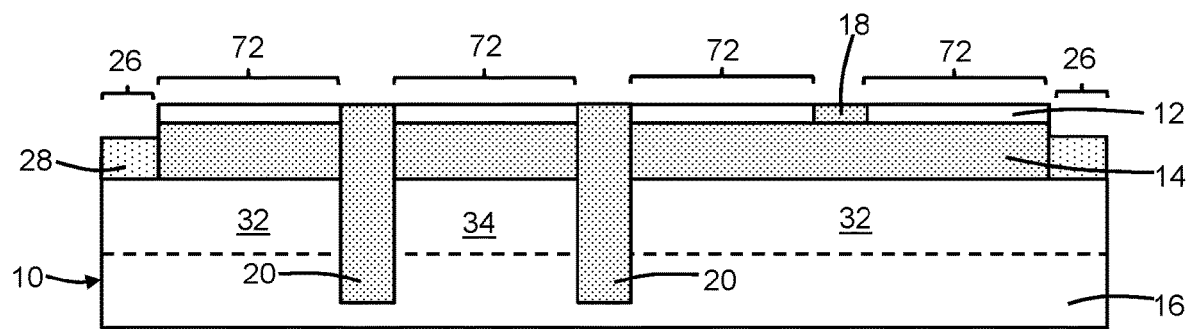
FIG. 2A is a cross-sectional view taken generally along line 2A-2A in FIG. 1.
Figure 2B:
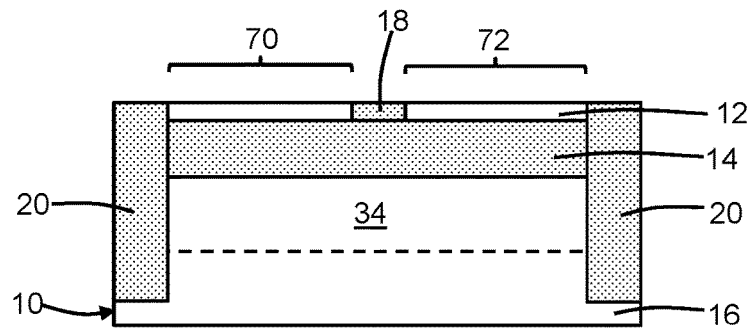
FIG. 2B is a cross-sectional view taken generally along line 2B-2B in FIG. 1.
Figure 3:
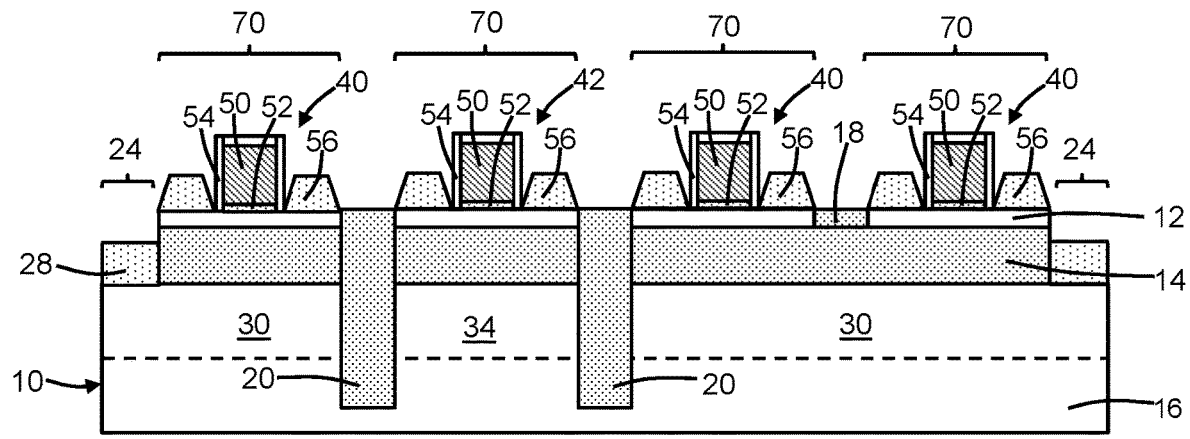
FIGS. 3, 3A, and 3B are respective cross-sectional views of the structure at a fabrication stage subsequent to FIGS. 2, 2A, and 2B.
Figure 3A:
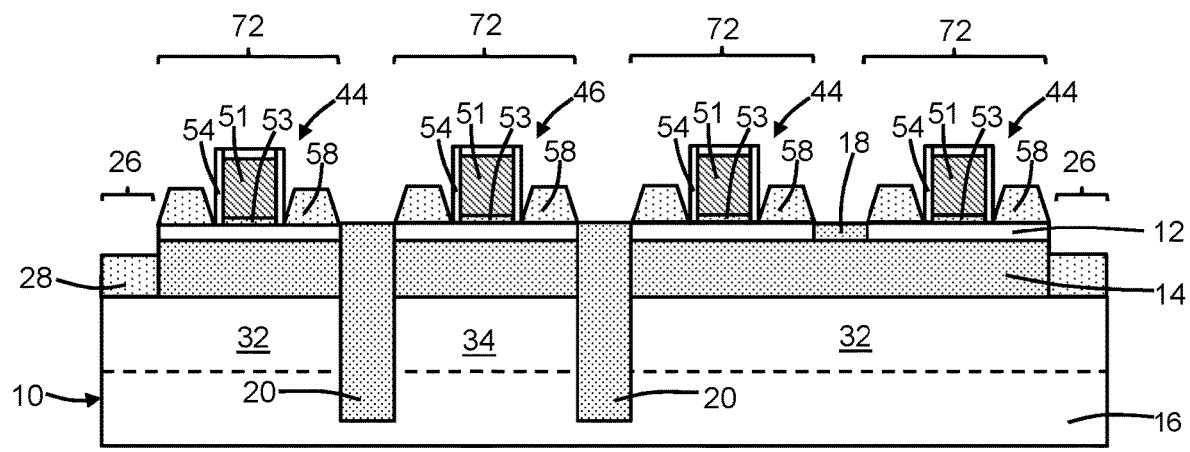
Figure 3B:
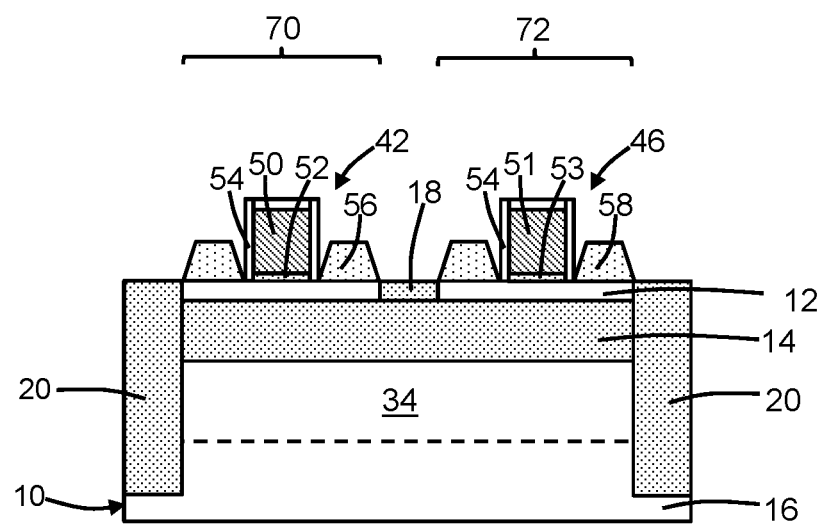

With reference to FIGS. 3, 3A, 3B in which like reference numerals refer to like features in FIGS. 2A, 2B, 2C and at a subsequent fabrication stage, field-effect transistors 40, 42, 44, 46 may be fabricated by complementary metal oxide semiconductor (CMOS) processes during front-end-of-line (FEOL) processing. The field-effect transistors 40 are arranged in the device areas 70 of the logic cells 74 (FIG. 1), the field-effect transistor 42 is arranged in the device area 70 of the logic cell 76 (FIG. 1), the field-effect transistors 44 are arranged in the device areas 72 of the logic cells 74, and the field-effect transistor 46 is arranged in the device area 72 of the logic cell 76. Each of the logic cells 74 includes one of the field-effect transistors 40 and one of the field-effect transistors 44 in which the field-effect transistors 40, 44 may be of complementary conductivity types and may be coupled together (e.g., cross-coupled) as an inverter pair. The logic cell 76 includes the field-effect transistor 42 and the field-effect transistor 46 in which the field-effect transistors 40, 44 may be of complementary conductivity types and may be coupled together (e.g., cross-coupled) as an inverter pair.

The field-effect transistors 40, 42 each include a gate structure consisting of a gate electrode 50 and a gate dielectric 52, and the field-effect transistors 44, 46 each include a gate structure consisting of a gate electrode 51 and a gate dielectric 53. The gate structures of the field-effect transistors 40, 42 are arranged over respective channel regions in the device layer 12, and the gate structures of the field-effect transistors 44, 46 are arranged over respective channel regions in the device layer 12. The gate dielectrics 52, 53 may be composed of a dielectric material, such as a high-k dielectric material like hafnium oxide (HfO$_2$), deposited by atomic layer deposition. The gate electrodes 50, 51 may include one or more conformal barrier metal layers and/or work function metal layers, such as layers composed of titanium aluminum carbide (TiAlC) and/or titanium nitride (TiN), deposited by atomic layer deposition, and a metal gate fill layer composed of a conductor, such as tungsten (W), deposited by chemical vapor deposition. The gate electrodes 50, 51 may include different combinations of the conformal barrier metal layers and/or work function metal layers. For example, the gate electrodes 50 may include work function metal layers characteristic of those suitable for a p-type field-effect transistor, and the gate electrodes 51 may include work function metal layers characteristic of those suitable for an n-type field-effect transistor.

Sidewall spacers 54 are formed on the device layer 12 at the sidewalls of the gate structures of the field-effect transistors 40, 42. The sidewall spacers 54 may be formed by depositing a conformal layer comprised of a dielectric material, such as silicon dioxide deposited by chemical vapor deposition, and shaping the conformal layer with an anisotropic etching process, such as reactive ion etching.

Raised source/drain regions 56 are formed adjacent to the spacer-clad gate structures of the field-effect transistors 40, 42, and raised source/drain regions 58 are formed adjacent to the spacer-clad gate structures of the field-effect transistors 44, 46. As used herein, the term "source/drain region" means a doped region of semiconductor material that can function as either a source or a drain of a field-effect transistor. The raised source/drain regions 56 are composed of an epitaxial semiconductor material that is grown by an epitaxial growth process using the crystal structure of the single-crystal semiconductor material of the device layer 12 as a growth template. The raised source/drain regions 56 are composed of an epitaxial semiconductor material that is grown by another epitaxial growth process using the crystal structure of the single-crystal semiconductor material of the device layer 12 as a growth template. For example, the semiconductor material constituting the raised source/drain regions 56 may be silicon-germanium (SiGe) having a germanium content ranging from twenty percent (20%) to fifty percent (50%), and the semiconductor material constituting the raised source/drain regions 58 may be silicon.

Figure 4:
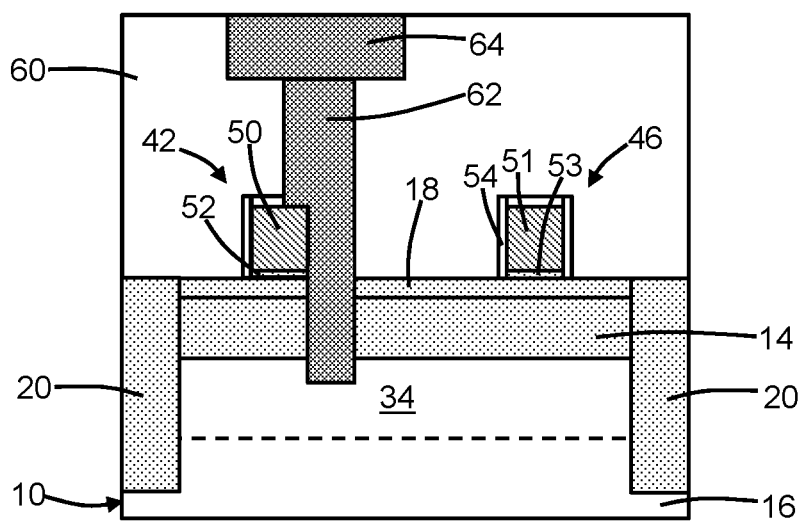
FIG. 4 is a cross-sectional view of the structure at a fabrication stage subsequent to FIGS. 3, 3A, and 3B.

With reference to FIG. 4 in which like reference numerals refer to like features in FIGS. 3, 3A, 3B and at a subsequent fabrication stage, silicidation, stress liner deposition, middle-of-line (MOL) processing, and back-end-of-line (BEOL) processing follow to provide an interconnect structure coupled with the field-effect transistors 40, 42, 44, 46. In that regard, an interlayer dielectric layer 60 may be formed over the field-effect transistors 40, 42, 44, 46. The interlayer dielectric layer 60 may be comprised of an electrically-insulating dielectric material, such as silicon dioxide.

A back-gate contact 62 is formed in the interlayer dielectric layer 60 that extends from a metal line 64, also formed in the interlayer dielectric layer 60, to the gate electrode 50 of the field-effect transistor 42, which may have the non-conductive spacer 54 and any gate cap removed to provide direct contact. The back-gate contact 62 may be formed at a location arranged over the shallow trench isolation regions 18. The back-gate contact 62 is located inside the outer boundary of the well 34, which is interior of the interface between the deep trench isolation regions 20 and the well 34. The back-gate contact 62 also extends through the shallow trench isolation regions 18 and the buried insulator layer 14 to directly contact the well 34 in the substrate 16. The back-gate contact 62 provides a back gate tap that directly couples the gate electrode 50 with the back gate provided by the well 34. In an alternative embodiment, the back-gate contact 62 may provide a back gate tap to the well 34 that is not directly connected with the gate electrode 50. Other contacts (not shown) may be formed in the interlayer dielectric layer 60 and connected with the field-effect transistors 40, 42, 44, 46.

The well 30 provides a back gate that is shared by the field-effect transistors 40 of device areas 70 and that is accessed for biasing though the back-gate contact areas 24. The well 32 provides a back gate that is shared by the field-effect transistors 44 of device areas 72 and that is accessed for biasing though the back-gate contact areas 26. The well 34 provides a back gate that is specifically shared by the field-effect transistor 42 and the field-effect transistor 46 constituting the logic cell 76 (FIG. 1) and that is accessed for biasing though the back-gate contact 62. The back gate (i.e., well 34) shared by the field-effect transistor 42 and field-effect transistor 46 is electrically and physically isolated by the deep trench isolation regions 20 from the back gate defined by the well 30 and from the back gate defined by the well 32. The sharing of the back gate by the field-effect transistors 42, 46 may permit dual-gate switching of the logic cell 76 including the field-effect transistors 42, 46, which may reduce both propagation delay and standby leakage. The back gate tap provided by the back-gate contact 62 permits the direct coupling of the gate electrode 50 with the back gate provided by the well 34, or a direct connection of with the back gate if not directly connected with the gate electrode 50, independent of the back gate taps provided by the back-gate contact areas 24 and the back-gate contact areas 26.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a first logic cell including a first field-effect transistor and a second field-effect transistor;
   a first well defining a first back gate that is arranged beneath the first field-effect transistor and the second field-effect transistor;
   a dielectric layer arranged between the first well and the first logic cell; and
   a plurality of deep trench isolation regions extending through the dielectric layer and arranged to surround the first field-effect transistor, the second field-effect transistor, and the first well,
   wherein the first back gate is shared by the first field-effect transistor and the second field-effect transistor.

2. The structure of claim 1 further comprising:
   a gate contact arranged to extend through the dielectric layer to the first well,
   wherein the gate contact provides a back-gate tap coupled with the first back gate defined by the first well.

3. The structure of claim 2 wherein the gate contact is arranged inside an outer boundary of the first well defined by the plurality of deep trench isolation regions.

4. The structure of claim 2 wherein the first field-effect transistor includes a gate electrode, and the gate contact is arranged to overlap with the gate electrode such that the gate electrode is coupled by the gate contact with the first well.

5. The structure of claim 1 further comprising:
   a second logic cell including a first field-effect transistor and a second field-effect transistor; and
   a second well defining a second back gate that is arranged beneath the first field-effect transistor of the second logic cell,
   wherein the dielectric layer is arranged between the second well and the first field-effect transistor of the second logic cell, and the first well is isolated from the second well by the plurality of deep trench isolation regions.

6. The structure of claim 5 further comprising:
   a back-gate tap coupled with the second well,
   wherein the first well is isolated from the back-gate tap by the plurality of deep trench isolation regions.

7. The structure of claim 5 further comprising:
   a third well defining a third back gate that is arranged beneath the second field-effect transistor of the second logic cell,
   wherein the dielectric layer is arranged between the third well and the second field-effect transistor of the second logic cell, and the first well is isolated from the third well by the plurality of deep trench isolation regions.

8. The structure of claim 7 wherein the first well and the second well contain semiconductor material of a first conductivity type, and the third well contains semiconductor material of a second conductivity type opposite from the first conductivity type.

9. The structure of claim 7 further comprising:
   a first back-gate tap coupled with the first well; and
   a second back-gate tap coupled with the second well; and
   a third back-gate tap coupled with the third well.

10. The structure of claim 1 wherein the first field-effect transistor and the second field-effect transistor of the first logic cell each include a channel region in a device layer of a silicon-on-insulator wafer, the dielectric layer is a buried insulator layer of the silicon-on-insulator wafer, and the first well is arranged in a substrate of the silicon-on-insulator wafer.

11. The structure of claim 10 wherein the device layer has a thickness in a range from about 3 nanometers to about 10 nanometers.

12. The structure of claim 1 wherein the first field-effect transistor is a p-type field-effect transistor, and the second field-effect transistor is an n-type field-effect transistor.

13. A method comprising:
    forming a first well in a substrate of a silicon-on-insulator wafer;
    forming a plurality of deep trench isolation regions extending through a buried insulator layer of the silicon-on-insulator wafer and arranged to surround the first well; and
    forming a first field-effect transistor and a second field-effect transistor of a first logic cell using a device layer of the silicon-on-insulator wafer and arranged over the first well,
    wherein the buried insulator layer of the silicon-on-insulator wafer is arranged between the first well and the first logic cell, and the first well defines a first back gate that is shared by the first field-effect transistor and the second field-effect transistor.

14. The method of claim 13 further comprising:
forming a gate contact arranged to extend through the buried insulator layer to the first well,
wherein the gate contact provides a back-gate tap coupled with the first back gate defined by the first well.

15. The method of claim 14 wherein the gate contact is arranged inside an outer boundary of the first well defined by the plurality of deep trench isolation regions.

16. The method of claim 14 wherein the first field-effect transistor includes a gate electrode, and the gate contact is arranged to overlap with the gate electrode such that the gate electrode is coupled by the gate contact with the first well.

17. The method of claim 13 further comprising:
forming a first field-effect transistor and a second field-effect transistor of a second logic cell; and
forming a second well in the substrate of the silicon-on-insulator wafer,
wherein the second well defines a second back gate that is arranged beneath the first field-effect transistor of the second logic cell, the buried insulator layer is arranged between the second well and the first field-effect transistor of the second logic cell, and the first well is isolated from the second well by the plurality of deep trench isolation regions.

18. The method of claim 17 further comprising:
forming a back-gate tap coupled with the second well,
wherein the first well is isolated from the back-gate tap by the plurality of deep trench isolation regions.

19. The method of claim 17 further comprising:
forming a third well that is arranged beneath the second field-effect transistor of the second logic cell,
wherein the third well defines a third back gate, the buried insulator layer is arranged between the third well and the second field-effect transistor of the second logic cell, and the first well is isolated from the third well by the plurality of deep trench isolation regions.

20. The method of claim 13 wherein the first field-effect transistor is a p-type field-effect transistor, and the second field-effect transistor is an n-type field-effect transistor.

* * * * *